US009620476B2

(12) United States Patent
Lee et al.

(10) Patent No.: US 9,620,476 B2
(45) Date of Patent: Apr. 11, 2017

(54) BONDING HEAD AND DIE BONDING APPARATUS HAVING THE SAME

(71) Applicants: SEMES CO., LTD., Cheonan-si, Chungcheongnam-do (KR); SAMSUNG ELECTRONICS CO., LTD., Suwon-si, Gyeonggi-do (KR)

(72) Inventors: Hang Lim Lee, Cheonan-si (KR); Jong Jin Weon, Cheonan-si (KR); Soon Hyun Kim, Cheonan-si (KR); Seung Dae Seok, Suwon-si (KR)

(73) Assignees: SEMES CO., LTD., Cheonan-si, Chungcheongnam-Do (KR); SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 410 days.

(21) Appl. No.: 14/532,190

(22) Filed: Nov. 4, 2014

(65) Prior Publication Data

US 2015/0129135 A1    May 14, 2015

(30) Foreign Application Priority Data

Nov. 13, 2013   (KR) .................. 10-2013-0137304

(51) Int. Cl.
*B32B 37/00*  (2006.01)
*H01L 23/00*  (2006.01)
*H01L 21/683* (2006.01)

(52) U.S. Cl.
CPC .......... *H01L 24/75* (2013.01); *H01L 21/6836* (2013.01); *H01L 2221/68327* (2013.01); *H01L 2224/759* (2013.01); *H01L 2224/7565* (2013.01); *H01L 2224/75252* (2013.01); *H01L 2224/75253* (2013.01); *H01L 2224/75301* (2013.01); *H01L 2224/75305* (2013.01);
(Continued)

(58) Field of Classification Search
CPC ..... H01L 24/75; B29C 35/16; B29C 35/1616; B29C 35/1625; B29C 66/349; B29C 66/8181; B32B 37/08
USPC .............................................. 156/498, 583.1
See application file for complete search history.

(56) References Cited

U.S. PATENT DOCUMENTS 6,585,853 B2 *  7/2003  Kitaguchi ......... H01L 21/67144
                                                  156/580.1
7,854,365 B2 * 12/2010  Li ........................... H01L 24/83
                                                  228/180.21
(Continued)

FOREIGN PATENT DOCUMENTS

JP       2003-303856     10/2003
JP       2012-129300      7/2012
KR    10-2013-0007657     1/2013

*Primary Examiner* — James Sells
(74) *Attorney, Agent, or Firm* — Kile Park Reed & Houtteman PLLC

(57) ABSTRACT

A bonding head and a die bonding apparatus having the same are disclosed. The bonding head includes a body connected to a driving section for transferring the die, a plate heater mounted to a lower surface of the body and a collet mounted to a lower surface of the plate heater and configured to hold the die using a vacuum pressure. A cooling channel is formed at the lower surface of the body, and cooling passages are formed through the body and connected with the cooling channel to supply a cooling fluid into the cooling channel and to recover the cooling fluid from the cooling channel thereby cooling the plate heater.

15 Claims, 7 Drawing Sheets

(52) U.S. Cl.
CPC ............ *H01L 2224/75312* (2013.01); *H01L 2224/75502* (2013.01); *H01L 2224/75745* (2013.01); *H01L 2224/81048* (2013.01); *H01L 2224/81203* (2013.01); *H01L 2224/83048* (2013.01); *H01L 2224/83203* (2013.01)

(56) References Cited

U.S. PATENT DOCUMENTS

| | | | |
|---|---|---|---|
| 8,998,620 B2 * | 4/2015 | Ni | H01R 12/71 361/737 |
| 2004/0041250 A1 * | 3/2004 | Nose | H01L 23/3107 257/690 |
| 2010/0003119 A1 * | 1/2010 | Nakamura | H01L 21/67132 414/800 |
| 2013/0316294 A1 * | 11/2013 | Wan | H01L 24/81 432/9 |

* cited by examiner

BONDING HEAD AND DIE BONDING APPARATUS HAVING THE SAME

CROSS-REFERENCE TO RELATED APPLICATION

This application claims priority to Korean Patent Application No. 10-2013-0137304, filed on Nov. 13, 2013 and all the benefits accruing therefrom under 35 U.S.C. §119, the contents of which are incorporated by reference in their entirety.

BACKGROUND

The present disclosure relates to a bonding head and a die bonding apparatus having the same. In more detail, the present disclosure relates to a bonding head for picking up a semiconductor die from a wafer and bonding the die to a substrate, and a die bonding apparatus including the bonding head.

In general, a bonding head is used to pick up dies individualized by a sawing process from a wafer and to bond the dies onto a substrate such as a printed circuit board, a lead frame, and the like. The bonding head includes a body connected to a driving section for transferring a die and a collet mounted to the body to pick up the die using a vacuum pressure.

The bonding head may include a heater for heating the die. For example, Korean Laid-Open Patent Publication No. 10-2013-0007657 discloses an electronic component mounting apparatus including a ceramic heater assembly and a bonding tool.

The bonding tool is mounted to the ceramic heater assembly, and the ceramic heater assembly includes a heater base with a built-in ceramic heater. The electronic component mounting apparatus have a first cooling passage for cooling the heat base and a second cooling passage for cooling the bonding tool. An air is used as a cooling fluid, and the air is discharged to the outside from the first and second cooling passages.

As described above, the air used as the cooling fluid is discharged into a process chamber in which a die bonding process is performed from the first and second cooling passages. Particles may be generated by the discharged air in the process chamber, and the wafer and the substrate may thus be contaminated by the particles.

Further, because both of the heater base and the bond tool is cooled by the air, the time required for cooling the heater base and bonding tool may be increased, and the productivity in the die bonding process may thus be deteriorated.

SUMMARY

The present disclosure provides a bonding head capable of decreasing the contamination in a process chamber in which a die bonding process is performed and shortening the time required for adjusting a temperature of the bonding head.

Further, the present disclosure provides a die bonding apparatus having the bonding head as described above.

In accordance with an aspect of the present invention, a bonding head for bonding a die to a substrate may include a body connected to a driving section for transferring the die, a plate heater mounted to a lower surface of the body, and a collet mounted to a lower surface of the plate heater and configured to hold the die using a vacuum pressure. Particularly, a cooling channel may be formed at the lower surface of the body, and cooling passages may be formed through the body and may be connected with the cooling channel to supply a cooling fluid into the cooling channel and to recover the cooling fluid from the cooling channel thereby cooling the plate heater.

In accordance with some exemplary embodiments, first and second cooling channels may be formed at the lower surface of the body, and the cooling passages may include first and second supply passages connected with the first and second cooling channels and first and second recovery passages connected with the first and second cooling channels.

In accordance with some exemplary embodiments, the first and second cooling channels may be disposed on both sides of a central portion of the plate heater, respectively.

In accordance with some exemplary embodiments, through-holes connected with each other may be formed through the plate heater and the collet, and a vacuum passage connected with the through-hole of the plate heater may be formed through the body.

In accordance with some exemplary embodiments, at least one vacuum channel may be formed at the lower surface of the plate heater to vacuum-absorb the collet, and a vacuum passage connected with the vacuum channel may be formed through the body.

In accordance with some exemplary embodiments, an inner vacuum channel surrounding a central portion of the plate heater and an outer vacuum channel surrounding the inner vacuum channel may be formed at the lower surface of the plate heater.

In accordance with some exemplary embodiments, inner and outer vacuum passages connected with the inner and outer vacuum channels, respectively, may be formed through the body, and the inner and outer vacuum passages may be disposed on both sides of the central portion of the plate heater, respectively.

In accordance with some exemplary embodiments, the bonding head may further include a temperature sensor for measuring a temperature of the plate heater.

In accordance with some exemplary embodiments, the body may include a mounting block connected to the driving section and an adiabatic block mounted to a lower portion of the mounting block. Particularly, the cooling channel may be formed at a lower surface of the adiabatic block.

In accordance with some exemplary embodiments, the body may include a mounting block connected to the driving section, an adiabatic block mounted to a lower portion of the mounting block, and a spacer mounted to a lower surface of the adiabatic block. Particularly, the cooling channel may be formed at a lower surface of the spacer.

In accordance with some exemplary embodiments, cooling fins may be disposed in the cooling channel.

In accordance with some exemplary embodiments, an upper cooling channel may be formed at an upper surface of the spacer, and the cooling channel and the upper cooling channel may be connected by through-holes with each other.

In accordance with another aspect of the present invention, an apparatus for bonding a die to a substrate may include a driving section for transferring the die, a bonding head comprising a body connected to the driving section, a plate heater mounted to a lower surface of the body, and a collet mounted to a lower surface of the plate heater and configured to hold the die using a vacuum pressure, and a cooling module connected with the bonding head. Particularly, a cooling channel may be formed at the lower surface of the body, and cooling passages may be formed through the body to connect the cooling channel with the cooling module. Further, the cooling module may supply a cooling fluid into the cooling channel and may recover the cooling fluid from the cooling channel so as to cool the plate heater.

In accordance with some exemplary embodiments, an air may be used as the cooling fluid, and the cooling module may be connected with the cooling passages by a supply pipe and a recovery pipe for supplying and recovering the air.

In accordance with some exemplary embodiments, the cooling module may include an exhausting device connected with the recovery pipe.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
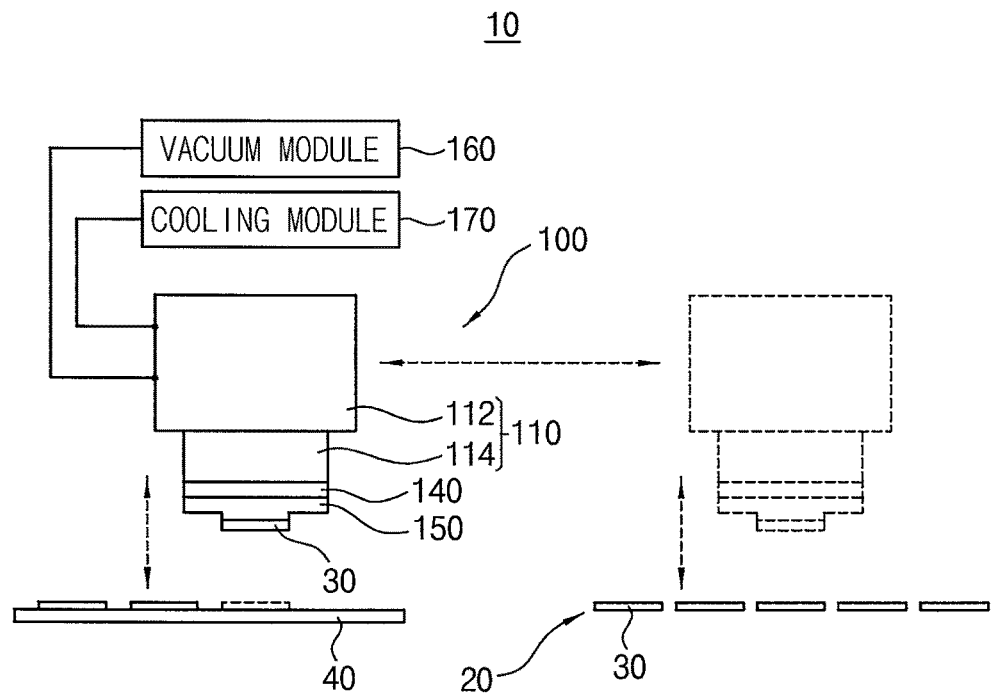
FIG. 1 is a schematic view illustrating a die bonding apparatus in accordance with an exemplary embodiment of the present invention.

Hereinafter, specific embodiments will be described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the inventive concept to those skilled in the art.

It will also be understood that when an element or layer is referred to as being 'on' another one, it can be directly on the other one, or one or more intervening elements or layers may also be present. On the other hand, it will be understood that when an element is directly disposed on or connected to another one, further another element can not be present therebetween. Also, though terms like a first, a second, and a third are used to describe various elements, compositions, areas and/or layers in various embodiments of the inventive concept, the elements, compositions, areas and/or layers are not limited to these terms.

In the following description, the technical terms are used only for explaining a specific exemplary embodiment while not limiting the present disclosure. Also, unless otherwise defined, all terms, including technical and scientific terms used herein have the same meaning as commonly understood by one of ordinary skill in the art to which the invention pertains. In conventional dictionaries, such as those limited to the above terms are described in the related art of the inventive concept and their meaning in the context of matching will be interpreted as having a meaning, unless clearly limited ideally or excessively outward intuit will not be interpreted.

The embodiments of the invention an ideal embodiment of the inventive concept with reference to the schematic diagrams illustrated. Accordingly, the illustrated shapes of the change from, for example, the production method and/or the tolerance of the changes are those that can be expected sufficiently. Thus, embodiments of the invention are described as illustrated in a limited area of a particular shape which is described as it is not a bar shape as including a deviation of at and, in the drawings described in these areas will approximate the shape of the sole to illustrate the precise shape of a zone not intended to limit the scope of the inventive concept, it is not desired.

Figure 2:
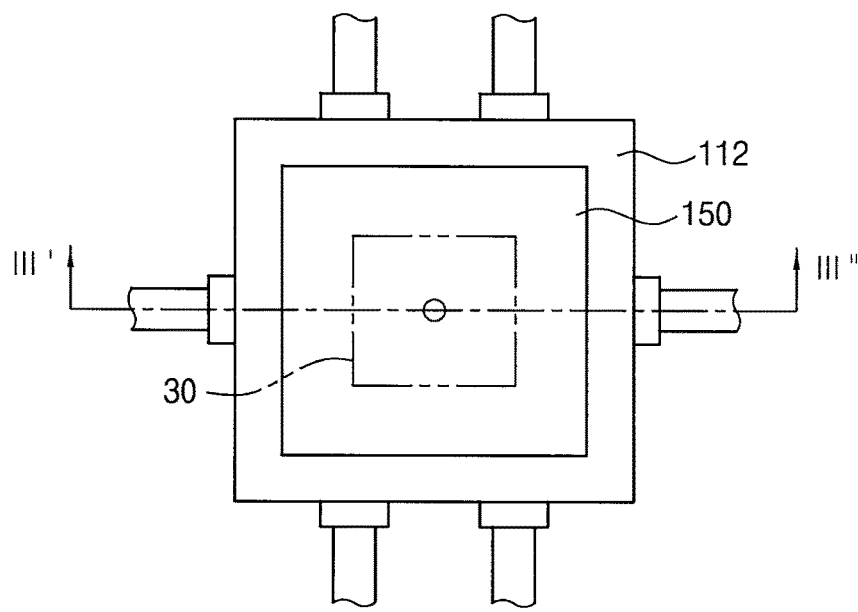
FIG. 2 is a bottom view illustrating a bonding head shown in FIG. 1.

FIG. 1 is a schematic view illustrating a die bonding apparatus in accordance with an exemplary embodiment of the present invention, and FIG. 2 is a bottom view illustrating a bonding head as shown in FIG. 1.

Referring to FIGS. 1 and 2, a die bonding apparatus 10 in accordance with an exemplary embodiment of the present invention may be used to pick up a die 30 from a wafer 20 which includes dies individualized by a sawing process and to bond the die 30 onto a substrate 40 such as a printed circuit board, a lead frame, and the like. Though not shown in figures, the dies 30 may be attached to a dicing film (not shown), and the dicing film may be mounted to a mounting frame (not shown) having a circular ring shape.

Further, the die 30 may be selectively separated from the dicing film by a die ejecting unit (not shown), and may be picked up by a bonding head 100. Particularly, the die bonding apparatus 10 may include a driving section (not shown) to which the bonding head 100 is mounted. The driving section may pick up the die 30 using the bonding head 100 and may move the picked up die 30 to bond to the substrate 40. For example, a Cartesian coordinate robot may be used as the driving section.

In accordance with an exemplary embodiment, the bonding head 100 may include a body 110 connected to the driving section, a plate heater 140 mounted to a lower surface of the body 110, and a collet 150 mounted to a lower surface of the plate heater 140 to pick up the die 30. For example, a ceramic heater may be used as the plate heater 140.

The body 110 may include a mounting block 112 connected to the driving section and an adiabatic block 114 mounted to a lower portion of the mounting block 112. The adiabatic block 114 may be used to prevent the heat transfer from the plate heater 140 to the mounting block 112. Though not shown in figures, the adiabatic block 114 may be mounted to the mounting block 112 by fastening members such as bolts, screws, and the like. Thus, the plate heater 140 may be thermally isolated by the adiabatic block 114.

Further, the plate heater 140 may be mounted to the lower surface of the body 110, that is, a lower surface of the adiabatic block 114 by fastening members such as bolts, screws, and the like, and may heat the die 30 in order to bond the die 30 onto the substrate 40. For example, the bonding head 100 may heat the die 30 and may then press the die 30 onto the substrate 40. The collet 150 may hold the die 30 to pick up and transfer the die 30 and may be used as a bonding tool. For example, the collet 150 may vacuum-absorb the die 30 using a vacuum pressure and may press the die 30 to bond the die 30 onto the substrate 40.

Figure 3:
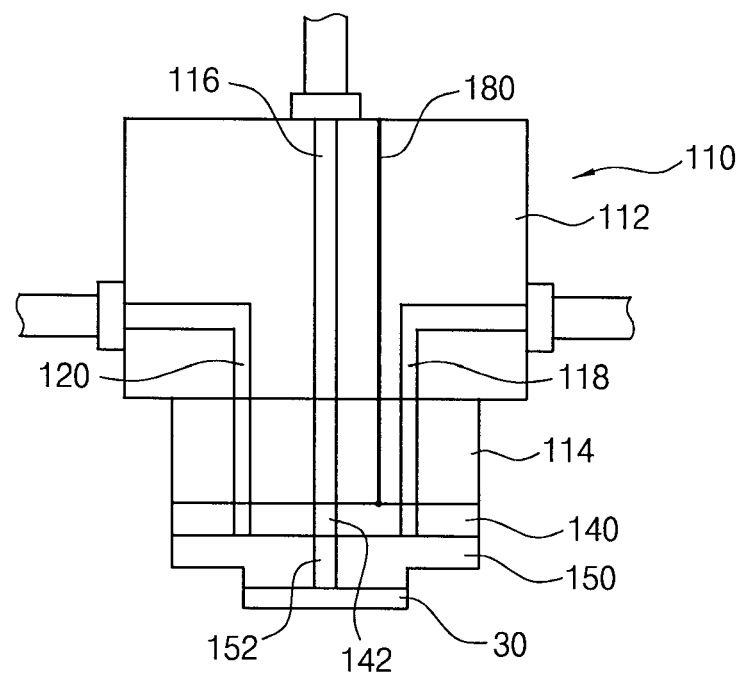
FIG. 3 is a cross-sectional view taken along a line III'-III' shown in FIG. 2.
Figure 4:
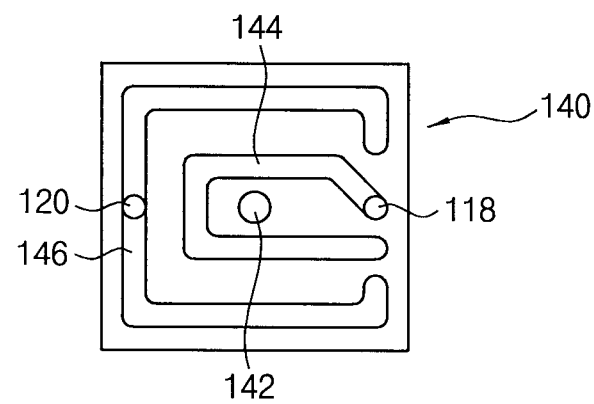
FIG. 4 is a bottom view illustrating a plate heater shown in FIG. 1.

FIG. 3 is a cross-sectional view taken along a line III'-III' shown in FIG. 2, and FIG. 4 is a bottom view illustrating the plate heater as shown in FIG. 1.

Referring to FIGS. 3 and 4, in accordance with an exemplary embodiment, the plate heater 140 and the collet 150 may have through-holes 142 and 152 connected with each other, respectively. The body 110 may have a first vacuum passage 116 connected with the through-hole 142 of the plate heater 140. For example, the through-holes 142 and 152 may be formed through central portions of the plate heater 140 and the collet 150, respectively, so as to be connected with each other. Further, the first vacuum passage 116 may be formed through a central portion of the body 110, that is, central portions of the mounting block 112 and the adiabatic block 114 so as to be connected with the through-hole 142 of the plate heater 140.

Though not shown in figures, the first vacuum passage 116 may be connected to a vacuum module 160 (see FIG. 1) including a vacuum pump, valves, or the like. The bonding head 100 may hold the die 30 using a vacuum pressure provided from the vacuum module 160.

In accordance with an exemplary embodiment, the collet 150 may be mounted to the lower surface of the plate heater 140 by using a vacuum pressure. For example, a vacuum channel may be formed at the lower surface of the plate heater 140 to vacuum-absorb the collet 150, and the body 110 may have a second vacuum passage connected with the vacuum channel.

For example, an inner vacuum channel 144 surrounding a central portion of the plate heater 140 and an outer vacuum channel 146 surrounding the inner vacuum channel 144 may be formed at the lower surface of the plate heater 140. As shown in the figures, the inner and outer vacuum channels 144 and 146 have an approximately rectangular ring shape. However, the shapes of the inner and outer vacuum channels 144 and 146 are not limited thereto and may be variously changed.

Further, an inner vacuum passage 118 and an outer vacuum passage 120 may be formed through the body 110. The inner vacuum passage 118 may be connected with the inner vacuum channel 144, and the outer vacuum passage 120 may be connected with the outer vacuum channel 146. The inner and outer vacuum passages 118 and 120 may be connected to the vacuum module 160, and the plate heater 140 may have through-holes to connect the inner and outer vacuum passages 118 and 120 with the inner and outer vacuum channels 144 and 146, respectively. Particularly, the inner and outer vacuum passages 118 and 120 may be disposed on both sides of the central portion of the plate heater 140, respectively, in order to uniformly apply the vacuum pressure to the collet 150 as shown in FIG. 4.

Figure 5:
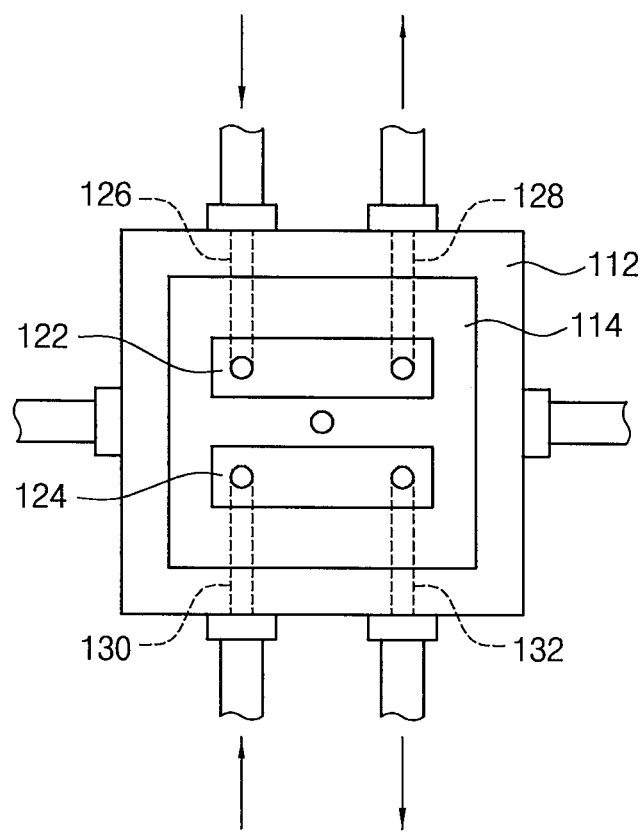
FIG. 5 is a bottom view illustrating a body shown in FIG. 1.
Figure 6:
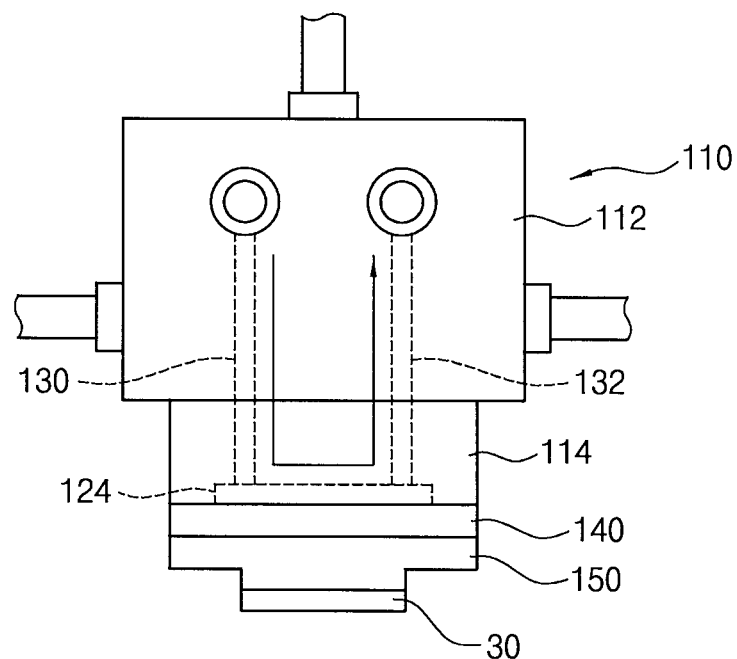
FIG. 6 is a front view illustrating the body shown in FIG. 1.
Figure 7:
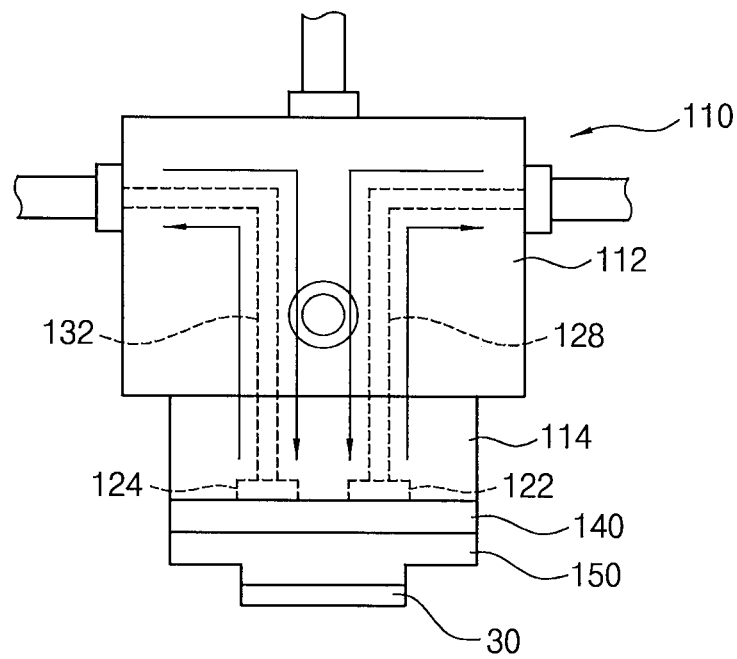
FIG. 7 is a side view illustrating the body shown in FIG. 1.

FIG. 5 is a bottom view illustrating the body as shown in FIG. 1, FIG. 6 is a front view illustrating the body as shown in FIG. 1, and FIG. 7 is a side view illustrating the body as shown in FIG. 1.

Referring FIGS. 5 to 7, in accordance with an exemplary embodiment, the body 110 may have a cooling channel to cool the plate heater 140. For example, the cooling channel may be formed at the lower surface of the body 110, that is, the lower surface of the adiabatic block 114. The cooling channel may be in contact with the an upper surface of the plate heater 140 mounted to the lower surface of the adiabatic block 114, and the plate heater 140 may be cooled by a cooling fluid supplied into the cooling channel.

The body 110 may have cooling passages connected with the cooling channel. For example, the cooling passages may be formed through the body 110 to be connected with the cooling channel in order to supply the cooling fluid into the cooling channel and to recover the cooling fluid from the cooling channel. Further, the cooling passages may be connected to a cooling module 170 (see FIG. 1) by a supply pipe and a recovery pipe.

In accordance with an exemplary embodiment, a first cooling channel 122 and a second cooling channel 124 may be formed at the lower surface of the adiabatic block 114. The cooling passages may include first and second supply passages 126 and 130 connected with the first and second cooling channels 122 and 124, and first and second recovery passages 128 and 132 connected with the first and second cooling channels 122 and 124.

Particularly, the first and second cooling channels 122 and 124 may be disposed on both sides of the central portion of the plate heater 140, respectively, in order to uniformly cool the plate heater 140, and areas that the first and second cooling channels 122 and 124 are in contact with the plate heater 140 may be equal to each other. Meanwhile, the number and the shape of the first and second cooling channels 122 and 124 may be variously changed, and thus the scope of the present invention is not limited by the number or the shape of the first and second cooling channels 122 and 124.

A dry air may be used as the cooling fluid. The cooling module 170 may include a flow rate control valve (not shown) for adjusting a flow rate of the dry air and a filter (not shown) for removing contaminants from the dry air. Further, the cooling module 170 may include an exhausting device such as an air pump, a fan, and the like, so as to recover the dry air with ease and improve the cooling rate of the plate heater 140. The exhausting device may be connected with the recovery pipe and may discharge the dry air recovered from the first and second cooling channels 122 and 124 to the outside of the die bonding apparatus 10.

Alternatively, the cooling module 170 may cool the dry air and may supply the cooled dry air into the first and second cooling channels 122 and 124. For example, the dry air may be cooled to a temperature below about zero degrees Celsius by the cooling module 170. In such case, it is desirable that the dry air has a dew point less than the cooling temperature of the dry air.

In accordance with another exemplary embodiment, a liquefied cooling fluid such as a cooling water, a brine solution, and the like, may be used as the cooling fluid. In such case, the cooling module 170 may circulate the liquefied cooling fluid through the first and second supply passages 126 and 130, the first and second cooling channels 122 and 124, and the first and second recovery passages 128 and 132.

The die bonding apparatus 10 may include a controller (not shown) to control operations of the plate heater 140 and the cooling module 170. Particularly, the bonding head 100 may include a temperature sensor 180 to measure a temperature of the plate heater 140 as shown in FIG. 3. The controller may control the operations of the plate heater 140 and the cooling module 170 according to the temperature of the plate heater 140 measured by the temperature sensor 180. For example, a thermocouple thermometer may be used as the temperature sensor 180.

Figure 8:
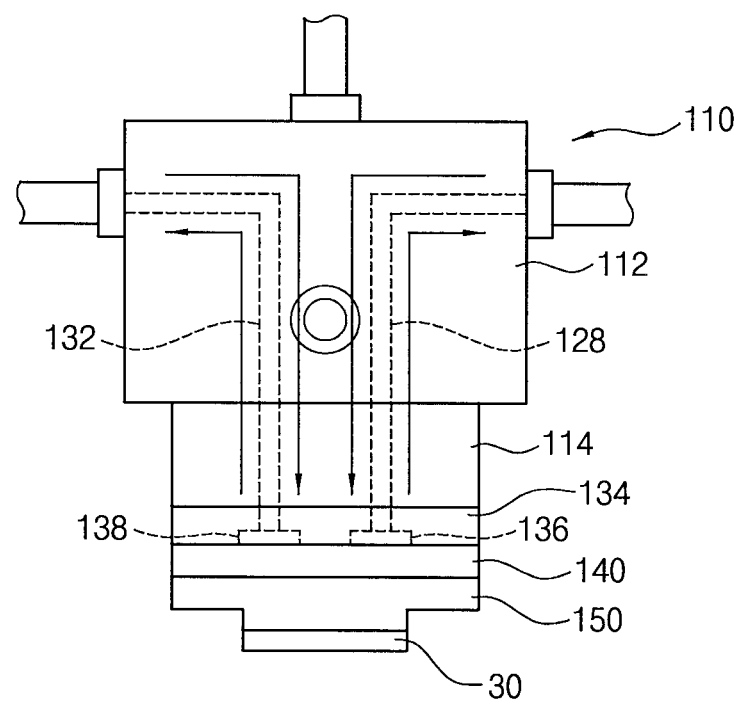
FIG. 8 is a side view illustrating a bonding head in accordance with another exemplary embodiment of the present invention.
Figure 9:
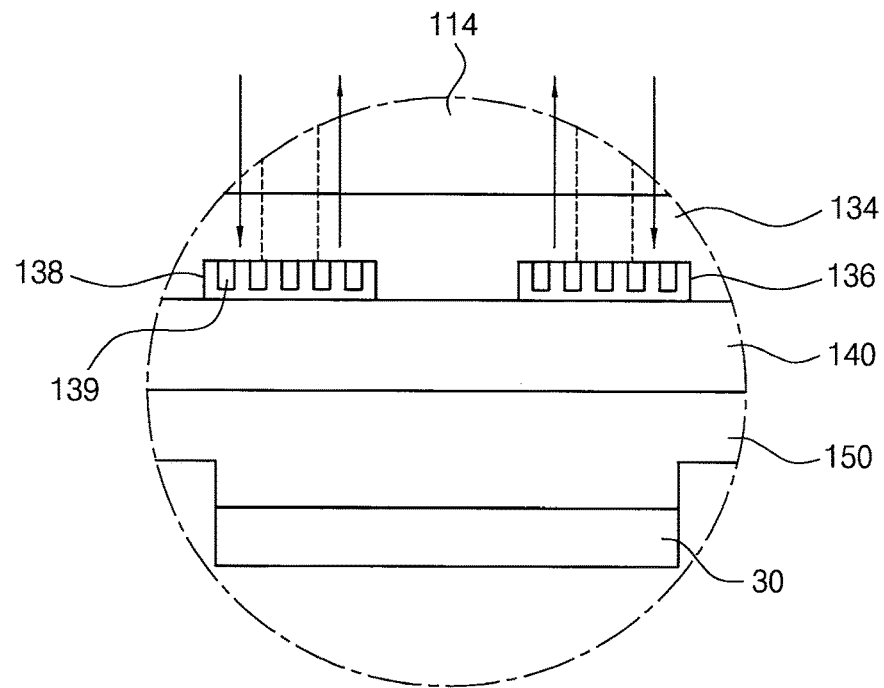
FIG. 9 is an enlarged cross-sectional view illustrating a spacer shown in FIG. 8.

FIG. 8 is a side view illustrating a bonding head in accordance with another exemplary embodiment of the present invention, and FIG. 9 is an enlarged cross-sectional view illustrating a spacer as shown in FIG. 8.

Referring to FIGS. 8 and 9, the body 110 may include a spacer 134 mounted to the lower surface of the adiabatic block 114. The spacer 134 may be made of a material having a relatively high thermal conductivity to improve the cooling rate of the plate heater 140. Cooling channels 136 and 138 may be formed at a lower surface of the spacer 134 and may be connected with the first and second supply passages 126 and 130 and the first and second recovery passages 128 and 132.

For example, the spacer 134 may be made of copper (Cu), aluminum (Al) or their alloys, and may have through-holes to connect the cooling channels 136 and 138 with the first and second supply passages 126 and 130 and the first and second recovery passages 128 and 132.

Particularly, cooling fins 139 may be disposed in the cooling channels 136 and 138 to improve the cooling rate of the plate heater 140 as shown in FIG. 9.

Figure 10:
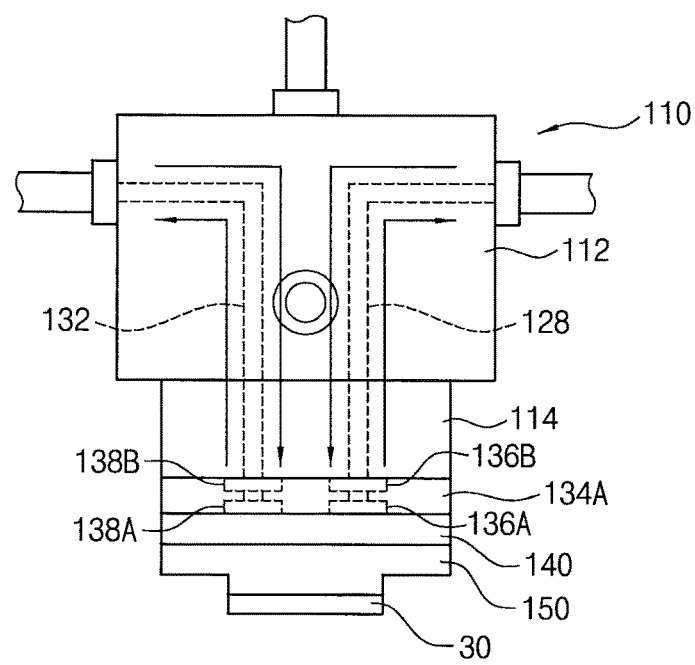
FIG. 10 is a side view illustrating a bonding head in accordance with still another exemplary embodiment of the present invention.
Figure 11:
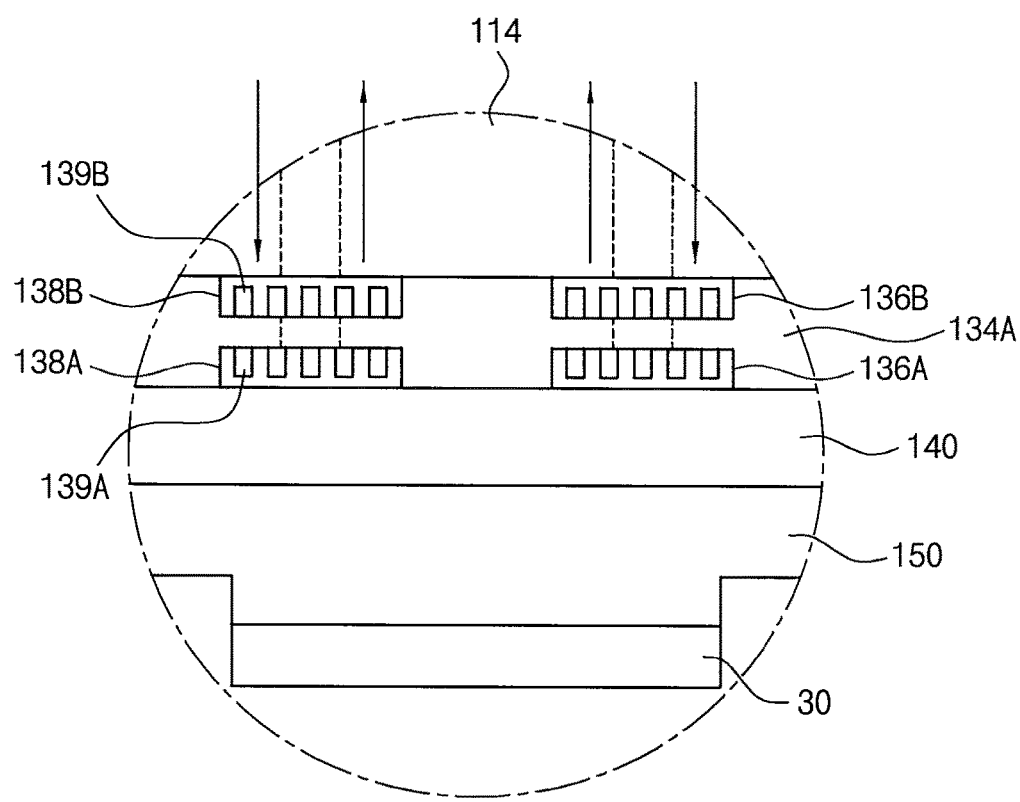
FIG. 11 is an enlarged cross-sectional view illustrating a spacer shown in FIG. 10.

FIG. 10 is a side view illustrating a bonding head in accordance with still another exemplary embodiment of the present invention, and FIG. 11 is an enlarged cross-sectional view illustrating a spacer as shown in FIG. 10.

Referring FIGS. 10 and 11, the body 110 may include a spacer 134A mounted to the lower surface of the adiabatic block 114. Lower cooling channels 136A and 138A and upper cooling channels 136B and 138B may be formed at a lower surface and an upper surface of the spacer 134A, respectively.

The upper cooling channels 136B and 138B may be connected with the first and second supply passages 126 and 130 and the first and second recovery passages 128 and 132. The spacer 134A may have through-holes to connect the lower cooling channels 136A and 138A with the upper cooling channels 136B and 138B.

The spacer 134A may be made of a material having a relatively high thermal conductivity such as copper (Cu), aluminum (Al) or their alloys, to improve the cooling rate of the plate heater 140. Particularly, cooling fins 139A and 139B may be disposed in the lower cooling channels 136A and 138A and the upper cooling channels 136B and 138B to improve the cooling rate of the plate heater 140.

According to the exemplary embodiments as described above, the cooling fluid used for cooling the plate heater 140 of the bonding head 100 may be recovered by the cooling module 170. Thus, the contamination in the process chamber in which the die bonding process is performed may be sufficiently decreased in comparison with the conventional art.

Further, the plate heater 140 may be thermally isolated by the adiabatic block 114, and thus the cooling fluid may cool only the plate heater 140. As a result, the cooling rate of the plate heater 140 may be sufficiently improved in comparison with the conventional art which cools both of the heater base and the bonding tool using the air.

Particularly, the spacer 134 having the cooling channels 136 and 138 may be disposed between the adiabatic block 114 and the plate heater 140. Thus, the cooling rate of the plate heater 140 may be more improved.

Although the bonding head and the die bonding apparatus having the same have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A bonding head for bonding a die to a substrate, the bonding head comprising:
a body connected to a driving section for transferring the die;
a plate heater mounted to a lower surface of the body; and
a collet mounted to a lower surface of the plate heater and configured to hold the die using a vacuum pressure, wherein
a cooling channel is formed at the lower surface of the body, and
cooling passages are formed through the body and connected with the cooling channel to supply a cooling fluid into the cooling channel and to recover the cooling fluid from the cooling channel thereby cooling the plate heater.

2. The bonding head of claim 1, wherein first and second cooling channels are formed at the lower surface of the body, and the cooling passages comprise first and second supply passages connected with the first and second cooling channels and first and second recovery passages connected with the first and second cooling channels.

3. The bonding head of claim 2, wherein the first and second cooling channels are disposed on both sides of a central portion of the plate heater, respectively.

4. The bonding head of claim 1, wherein through-holes connected with each other are formed through the plate heater and the collet, and a vacuum passage connected with the through-hole of the plate heater is formed through the body.

5. The bonding head of claim 1, wherein at least one vacuum channel is formed at the lower surface of the plate heater to vacuum-absorb the collet, and a vacuum passage connected with the vacuum channel is formed through the body.

6. The bonding head of claim 5, wherein an inner vacuum channel surrounding a central portion of the plate heater and an outer vacuum channel surrounding the inner vacuum channel are formed at the lower surface of the plate heater.

7. The bonding head of claim 6, wherein inner and outer vacuum passages connected with the inner and outer vacuum channels, respectively, are formed through the body, and the inner and outer vacuum passages are disposed on both sides of the central portion of the plate heater, respectively.

8. The bonding head of claim 1, further comprising a temperature sensor for measuring a temperature of the plate heater.

9. The bonding head of claim 1, wherein the body comprising:
a mounting block connected to the driving section; and
an adiabatic block mounted to a lower portion of the mounting block, wherein
the cooling channel is formed at a lower surface of the adiabatic block.

10. The bonding head of claim 1, wherein the body comprising:
a mounting block connected to the driving section;
an adiabatic block mounted to a lower portion of the mounting block; and
a spacer mounted to a lower surface of the adiabatic block, wherein
the cooling channel is formed at a lower surface of the spacer.

11. The bonding head of claim 10, wherein cooling fins are disposed in the cooling channel.

12. The bonding head of claim 10, wherein an upper cooling channel is formed at an upper surface of the spacer, and the cooling channel and the upper cooling channel are connected by through-holes with each other.

13. An apparatus for bonding a die to a substrate, the apparatus comprising:
   a driving section for transferring the die;
   a bonding head comprising a body connected to the driving section, a plate heater mounted to a lower surface of the body, and a collet mounted to a lower surface of the plate heater and configured to hold the die using a vacuum pressure; and
   a cooling module connected with the bonding head, wherein
   a cooling channel is formed at the lower surface of the body,
   cooling passages are formed through the body to connect the cooling channel with the cooling module, and
   the cooling module supplies a cooling fluid into the cooling channel and recovers the cooling fluid from the cooling channel so as to cool the plate heater.

14. The apparatus of claim 13, wherein an air is used as the cooling fluid, and the cooling module is connected with the cooling passages by a supply pipe and a recovery pipe for supplying and recovering the air.

15. The apparatus of claim 14, wherein the cooling module comprises an exhausting device connected with the recovery pipe.

* * * * *